(12) United States Patent
Bhakta et al.

(10) Patent No.: US 7,869,300 B2
(45) Date of Patent: Jan. 11, 2011

(54) MEMORY DEVICE CONTROL FOR SELF-REFRESH MODE

(75) Inventors: Dharmeshkumar N. Bhakta, Milpitas, CA (US); John C. Kriz, Palmerton, PA (US); Eric D. Persson, Tokyo (JP)

(73) Assignee: Agere Systems Inc., Allentown, PA (US)

( * ) Notice: Subject to any disclaimer, the term of this patent is extended or adjusted under 35 U.S.C. 154(b) by 76 days.

(21) Appl. No.: 12/431,876

(22) Filed: Apr. 29, 2009

(65) Prior Publication Data

US 2010/0278000 A1    Nov. 4, 2010

(51) Int. Cl.
*G11C 5/14* (2006.01)
(52) U.S. Cl. .......................... 365/228; 365/226; 365/229
(58) Field of Classification Search ................. 365/228, 365/226, 229
See application file for complete search history.

(56) References Cited

U.S. PATENT DOCUMENTS

| | | | | |
|---|---|---|---|---|
| 5,831,467 A * | 11/1998 | Leung et al. | ................. | 327/319 |
| 6,564,329 B1 * | 5/2003 | Cheung et al. | ............... | 713/322 |
| 6,917,546 B2 * | 7/2005 | Matsui | ........................ | 365/198 |
| 6,928,007 B2 * | 8/2005 | Jin | .............................. | 365/194 |
| 7,164,611 B2 * | 1/2007 | Kinsley | ....................... | 365/195 |
| 7,196,966 B2 * | 3/2007 | Jin | ......................... | 365/233.11 |
| 7,348,819 B2 * | 3/2008 | Choi | ........................... | 327/158 |
| 7,715,264 B2 * | 5/2010 | Meyer et al. | ................. | 365/222 |
| 7,729,191 B2 * | 6/2010 | Smith et al. | .................. | 365/226 |
| 7,786,752 B2 * | 8/2010 | Oh et al. | ........................ | 326/30 |
| 2002/0144166 A1 | 10/2002 | Chang et al. | | |
| 2006/0047985 A1 | 3/2006 | Otani | | |
| 2008/0031073 A1* | 2/2008 | Brandt | ........................ | 365/229 |

OTHER PUBLICATIONS

Written Opinion and European Search Report issued Jun. 23, 2010 in EP 10 15 8253 (received Aug. 10, 2010).

* cited by examiner

*Primary Examiner*—Viet Q Nguyen
(74) *Attorney, Agent, or Firm*—Mendelsohn, Drucker, & Associates, P.C.; Steve Mendelsohn

(57) ABSTRACT

In memory circuitry, to ensure that a memory device, such as a DDR3 RDIMM, safely operates in self-refresh mode while the memory controller is powered down and off, the memory device's clock enable (CKE) input is connected to both (i) the CKE signal applied by the memory controller and (ii) a termination voltage provided by the power module. To power down the memory controller, the memory controller drives the CKE signal low, then the power module drives the termination voltage low, then the power module powers down the memory controller. To resume normal operations, the power module powers up the memory controller, then the memory controller drives the CKE signal low, then the power module powers up the termination voltage. By holding the termination voltage low, the memory circuitry ensures that the memory device stays in self-refresh mode while the memory device is powered down and off.

20 Claims, 3 Drawing Sheets

MEMORY DEVICE CONTROL FOR SELF-REFRESH MODE

BACKGROUND OF THE INVENTION

1. Field of the Invention

The present invention relates to electronics, and, in particular, to memory devices having self-refresh modes.

2. Description of the Related Art

In typical computer hardware architectures, an integrated circuit (IC) memory device chip is controlled by a separate IC memory controller chip that controls the writing of data to and the reading of data from the memory device during normal operations of the memory device. Some memory devices are capable of operating in a self-refresh mode in which the memory device maintains its stored data even when the memory controller is powered off.

For some memory devices, such as DDR1 and DDR2 registered dual in-line memory modules (RDIMMs), where DDR stands for "double data rate," the memory device's RESET signal can be used to keep the memory device in self-refresh mode by holding the memory device's clock enable (CKE) line low while allowing the memory controller to be powered down. For other memory devices, such as DDR3 RDIMM memory devices, asserting the RESET signal takes the memory device out of self-refresh mode. As such, when the memory controller is powered off, the RESET signal cannot be used to keep the memory device in self-refresh mode, thereby jeopardizing the integrity of the data stored in the memory device.

SUMMARY OF THE INVENTION

In one embodiment, the present invention is a method for operating memory circuitry having a memory device, a memory controller, and a power module. The memory controller controls normal operations of the memory device by applying a clock enable (CKE) signal to a CKE input of the memory device, wherein the CKE input is further connected to a CKE termination node powered to a CKE termination voltage by the power module. The memory controller is then powered down by (1) the memory controller driving the CKE signal low, (2) then the power module powering down the CKE termination voltage, and (3) then the power module powering down the memory controller.

In another embodiment, the present invention is a circuitry comprising (1) a memory device having a CKE input, (2) a memory controller connected to apply a CKE signal to the CKE input, and (3) a power module connected to apply a CKE termination voltage to a CKE termination node connected to the CKE input. During normal operations, the memory controller applies the CKE signal to the CKE input with the power module applying the CKE termination voltage to the CKE termination node. During power-down operations, the memory controller drives the CKE signal low, followed by the power module powering down the CKE termination voltage, followed by the power module powering down the memory controller.

In yet another embodiment, the present invention is a power module for circuitry comprising a memory device having a CKE input and a memory controller connected to apply a CKE signal to the CKE input. The power module is adapted to be connected to apply a CKE termination voltage to a CKE termination node connected to the CKE input. During normal operations, the memory controller applies the CKE signal to the CKE input with the power module applying the CKE termination voltage to the CKE termination node. During power-down operations, the memory controller drives the CKE signal low, followed by the power module powering down the CKE termination voltage, followed by the power module powering down the memory controller.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

As used in this specification, the term "powered off" refers to a state of an integrated circuit (IC) chip in which no power is applied to the chip. The term "powered on" refers to a state in which power is applied to the chip. The term "powering up" refers to a transition from the powered-off state to the powered-on state, while the term "powering down" refers to a transition from the powered-on state to the powered-off state.

Figure 1:
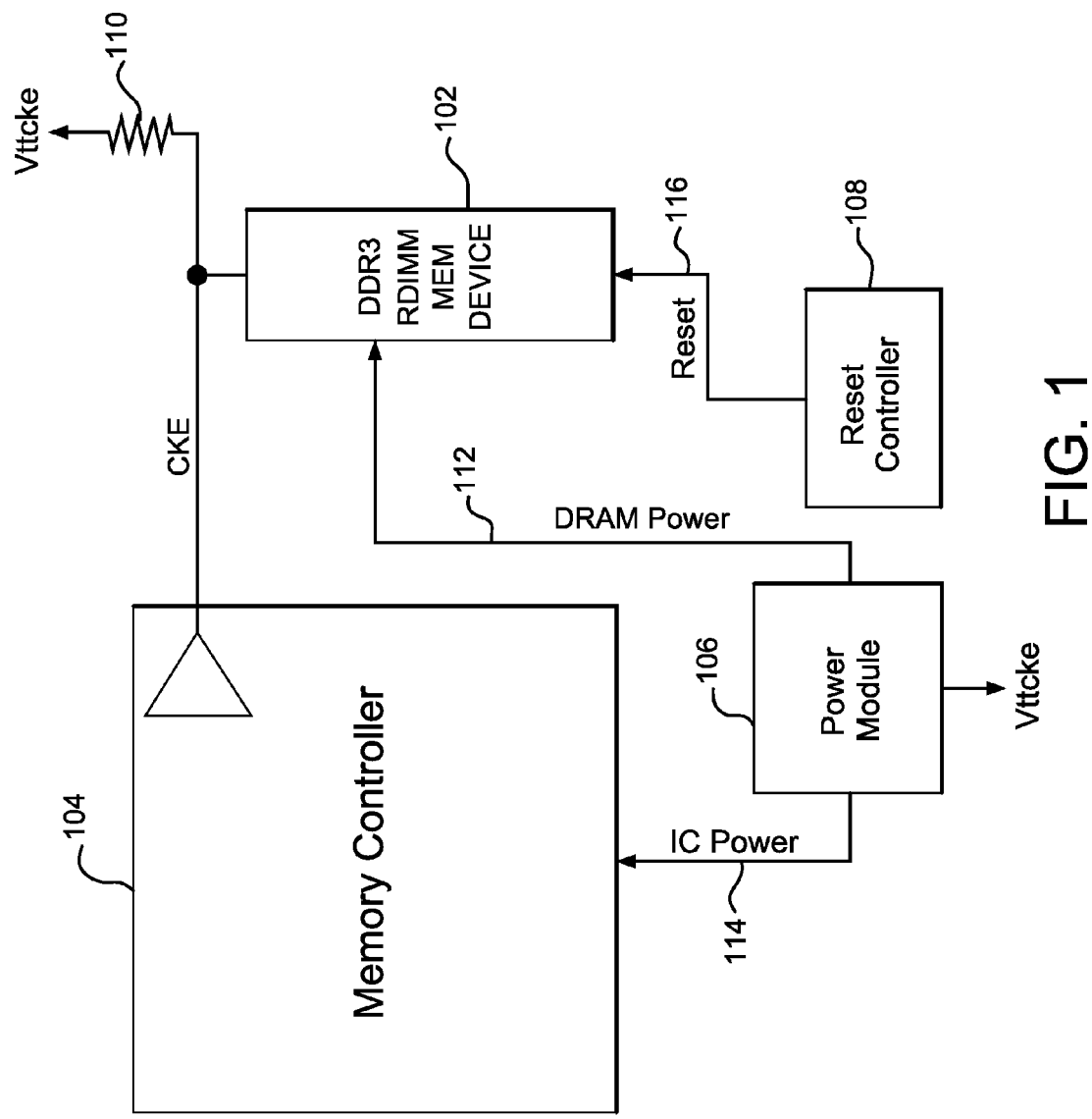
FIG. 1 shows a simplified block diagram of memory circuitry according to one embodiment of the present invention.

FIG. 1 shows a simplified block diagram of memory circuitry 100, according to one embodiment of the present invention. Memory circuitry 100 includes DDR3 RDIMM memory device 102, memory controller 104, power module 106, reset controller 108, and termination resistor 110. Memory controller 104 controls the writing of data to and the reading of data from memory device 102. Power module 106 provides power to memory device 102 and memory controller 104 via power lines 112 and power lines 114, respectively. In addition, power module 106 provides termination voltage Vttcke to termination resistor 110, where power module 106 is capable of powering down the termination voltage Vttcke, while maintaining the other DRAM power lines 112 powered on. In FIG. 1, Vttcke refers to both a termination node and to the termination voltage applied to that termination node by power module 106. Reset controller 108 applies (active low) reset signal 116 to reset memory device 102.

In addition to many different signals that are not shown in FIG. 1, memory controller 104 applies clock enable signal CKE to CKE input 118 of memory device 102. In order for memory controller 104 to be able to write data to and read data from memory device 102, the CKE signal must be high. As shown in FIG. 1, in addition to being connected to the CKE signal from memory controller 104, CKE input 118 of memory device 102 is also connected to the termination voltage Vttcke from power module 106 via termination resistor 110.

In one implementation, each element shown in FIG. 1, including termination resistor 110, is a discrete electronic module mounted on a circuit board and interconnected via suitable board traces. Memory controller 104 may be part of a larger integrated circuit module that provides, in addition to the control of memory device 102, other functions related to other system elements not shown in FIG. 1. Similarly, power module 106 may provide power to other system elements not shown in FIG. 1, including other memory devices.

Figure 2:
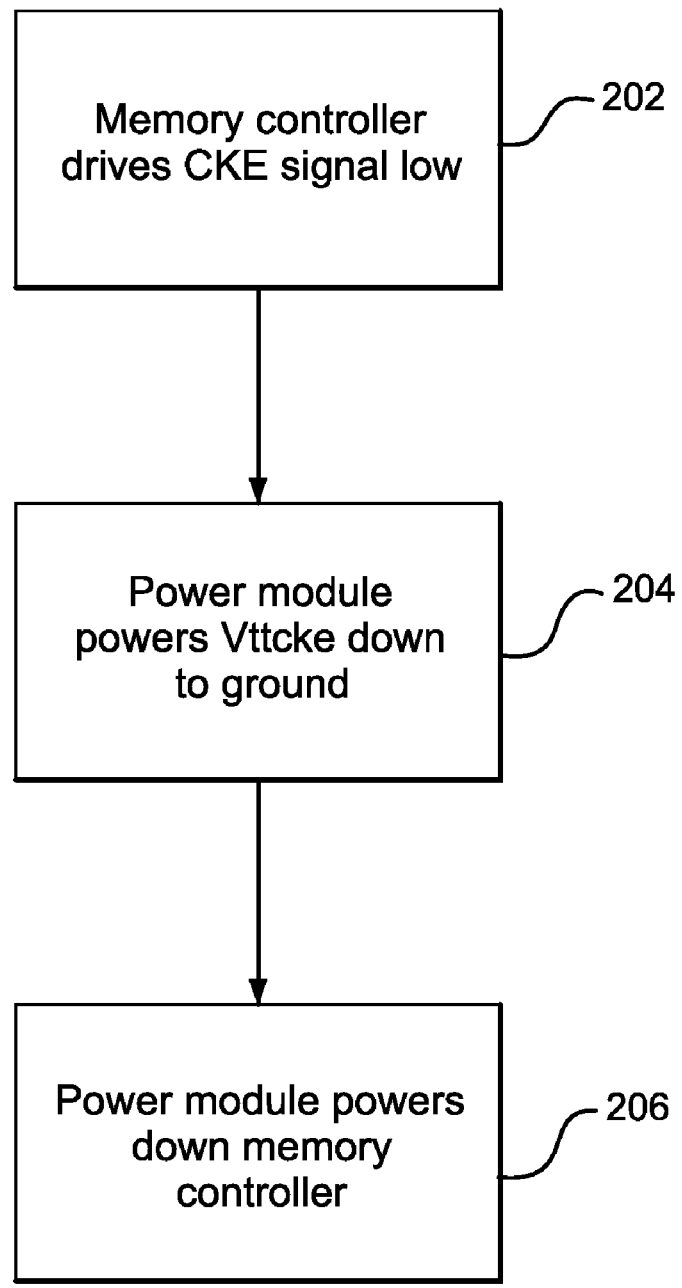
FIG. 2 shows a flow diagram of the procedure for powering down the memory circuitry of FIG. 1, according to one embodiment of the present invention.

FIG. 2 shows a flow diagram of the procedure for powering down memory circuitry 100 of FIG. 1, according to one embodiment of the present invention. In step 202, memory controller 104 drives the CKE signal low, thereby placing memory device 102 in self-refresh mode. In step 204, power module 106 powers the termination voltage Vttcke down to ground. In step 206, power module 106 powers down memory controller 104. By holding the termination voltage Vttcke low, memory circuitry 100 ensures that memory device 102 stays in self-refresh mode while memory controller 104 is powered down and as long as memory controller 104 remains powered off. Note that, during the entire procedure of FIG. 2, power module 102 maintains DRAM power lines 112 at their normal operating levels, and reset controller 108 maintains (active low) reset signal 116 at a high level. This enables memory controller 104 to be completely powered off.

Figure 3:
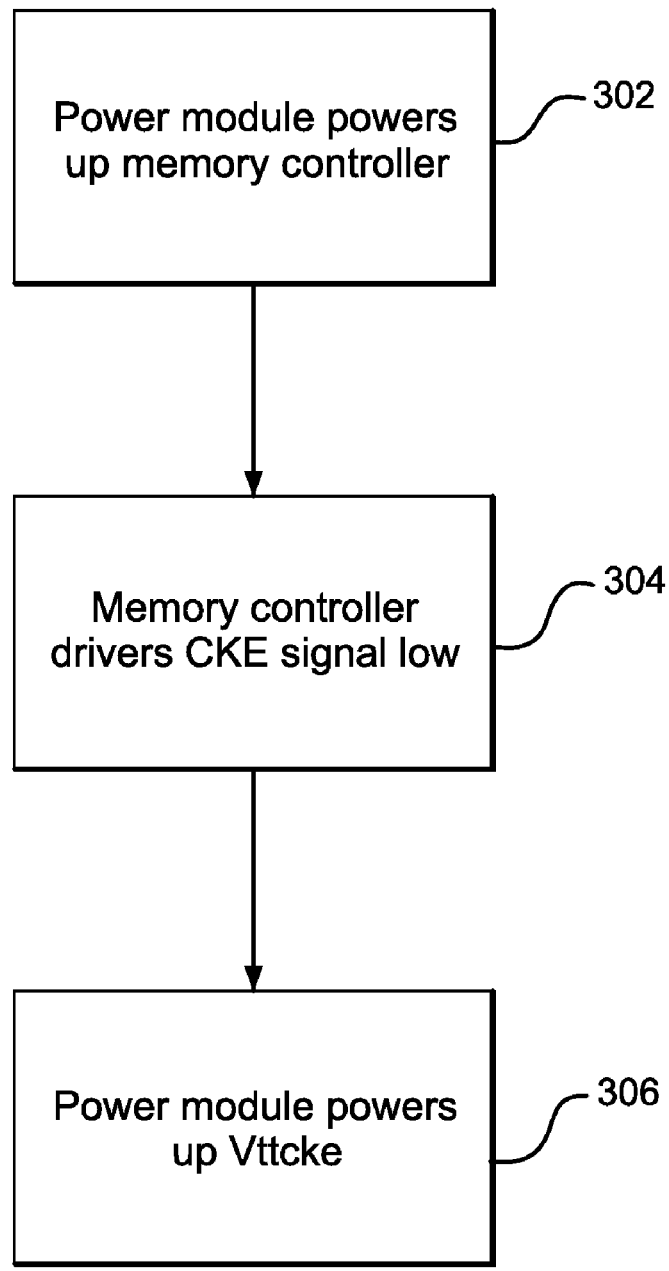
FIG. 3 shows a flow diagram of the procedure for powering up the memory circuitry of FIG. 1 following the power-down procedure of FIG. 2, according to one embodiment of the present invention.

FIG. 3 shows a flow diagram of the procedure for powering up memory circuitry 100 of FIG. 1 following the power-down procedure of FIG. 2, according to one embodiment of the present invention. In step 302, power module 106 powers up memory controller 104. In step 304, memory controller 104 drives the CKE signal low, which is the initial default setting for power-on reset. In step 306, power module 106 powers up the termination voltage Vttcke. By holding the termination voltage Vttcke low, memory circuitry 100 ensures that memory device 102 stays in self-refresh mode until memory controller 104 is powered up and able to resume control over the operations of memory device 102. Here, too, during the entire procedure of FIG. 3, power module 106 maintains DRAM power lines 112 at their normal operating levels, and reset controller 108 maintains reset signal 116 at a high level.

Although the present invention has been described in the context of memory circuitry 100 of FIG. 1 having termination resistor 110, it will be understood that other suitable types and combinations of impedance devices can be used to connect the CKE input of the memory device to a suitable termination voltage.

Although the present invention has been described in the context of memory circuitry 100 of FIG. 1 having a single DDR3 RDIMM memory device, it will be understood that, in general, the present invention can be implemented for any suitable type of memory topology having one or more memory devices, where those memory devices can be RDIMMs, such as DDR1, DDR2, or DDR3 RDIMMs, or other suitable on-board devices.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

What is claimed is:

1. A method for operating memory circuitry having a memory device, a memory controller, and a power module, the method comprising:
   (a) the memory controller controlling normal operations of the memory device by applying a clock enable (CKE) signal to a CKE input of the memory device, wherein the CKE input is further connected to a CKE termination node powered to a CKE termination voltage by the power module; and
   (b) then powering down the memory controller by:
      (b1) the memory controller driving the CKE signal low;
      (b2) then the power module powering down the CKE termination voltage; and
      (b3) then the power module powering down the memory controller.

2. The invention of claim 1, further comprising:
   (c) then powering up the memory controller by:
      (c1) the power module powering up the memory controller;
      (c2) then the memory controller driving the CKE signal low; and
      (c3) then the power module powering up the CKE termination voltage.

3. The invention of claim 1, wherein the memory device is a registered dual in-line memory module (RDIMM).

4. The invention of claim 3, wherein the RDIMM memory device is a double-data-rate three (DDR3) RDIMM memory device.

5. The invention of claim 1, wherein the power module applies one or more other voltages to the memory device, wherein, in step (b2), the power module powers down the CKE termination voltage while maintaining the one or more other voltages powered on.

6. The invention of claim 1, wherein the CKE termination node is connected to the CKE input via a resistor.

7. The invention of claim 1, wherein:
the method further comprises (c) then powering up the memory controller by:
  (c1) the power module powering up the memory controller;
  (c2) then the memory controller driving the CKE signal low; and
  (c3) then the power module powering up the CKE termination voltage;
the power module applies one or more other voltages to the memory device, wherein, in step (b2), the power module powers down the CKE termination voltage while maintaining the one or more other voltages powered on; and
the CKE termination node is connected to the CKE input via a resistor.

8. Circuitry comprising:
a memory device having a clock enable (CKE) input;
a memory controller connected to apply a CKE signal to the CKE input; and
a power module connected to apply a CKE termination voltage to a CKE termination node connected to the CKE input, wherein:
  during normal operations, the memory controller applies the CKE signal to the CKE input with the power module applying the CKE termination voltage to the CKE termination node; and
  during power-down operations, the memory controller drives the CKE signal low, followed by the power module powering down the CKE termination voltage, followed by the power module powering down the memory controller.

9. The invention of claim 8, wherein, during power-up operations, the power module powers up the memory controller, followed by the memory controller driving the CKE signal low, followed by the power module powering up the CKE termination voltage.

10. The invention of claim 8, wherein the memory device is a registered dual in-line memory module (RDIMM).

11. The invention of claim 10, wherein the RDIMM memory device is a double-data-rate three (DDR3) RDIMM memory device.

12. The invention of claim 8, wherein the power module is adapted to apply one or more other voltages to the memory device, wherein, during the power-down operations, the power module powers down the CKE termination voltage, while maintaining the one or more other voltages powered on.

13. The invention of claim 8, further comprising a resistor connected between the CKE input and the CKE termination node.

14. The invention of claim 8, wherein:
during power-up operations, the power module powers up the memory controller, followed by the memory controller driving the CKE signal low, followed by the power module powering up the CKE termination voltage;
the power module is adapted to apply one or more other voltages to the memory device, wherein, during the power-down operations, the power module powers down the CKE termination voltage, while maintaining the one or more other voltages powered on; and
the circuitry further comprises a resistor connected between the CKE input and the CKE termination node.

15. A power module for circuitry comprising a memory device having a clock enable (CKE) input and a memory controller connected to apply a CKE signal to the CKE input, wherein:
the power module is adapted to be connected to apply a CKE termination voltage to a CKE termination node connected to the CKE input;
during normal operations, the memory controller applies the CKE signal to the CKE input with the power module applying the CKE termination voltage to the CKE termination node; and
during power-down operations, the memory controller drives the CKE signal low, followed by the power module powering down the CKE termination voltage, followed by the power module powering down the memory controller.

16. The invention of claim 15, wherein, during power-up operations, the power module powers up the memory controller, followed by the memory controller driving the CKE signal low, followed by the power module powering up the CKE termination voltage.

17. The invention of claim 15, wherein the memory device is a double-data-rate three (DDR3) registered dual in-line memory module (RDIMM).

18. The invention of claim 15, wherein the power module is adapted to apply one or more other voltages to the memory device, wherein, during the power-down operations, the power module powers down the CKE termination voltage, while maintaining the one or more other voltages powered on.

19. The invention of claim 15, wherein the circuitry further comprises a resistor connected between the CKE input and the CKE termination node.

20. The invention of claim 15, wherein:
during power-up operations, the power module powers up the memory controller, followed by the memory controller driving the CKE signal low, followed by the power module powering up the CKE termination voltage;
the power module is adapted to apply one or more other voltages to the memory device, wherein, during the power-down operations, the power module powers down the CKE termination voltage, while maintaining the one or more other voltages powered on; and
the circuitry further comprises a resistor connected between the CKE input and the CKE termination node.

* * * * *

UNITED STATES PATENT AND TRADEMARK OFFICE
CERTIFICATE OF CORRECTION

PATENT NO. : 7,869,300 B2  
APPLICATION NO. : 12/431876  
DATED : January 11, 2011  
INVENTOR(S) : Dharmeshkumar N. Bhakta et al.

It is certified that error appears in the above-identified patent and that said Letters Patent is hereby corrected as shown below:

On the cover page, section (73) Assignee, please replace "Agere Systems Inc., Allentown, PA (US)" with --LSI Corporation, Milpitas, CA (US)--.

Signed and Sealed this
Twenty-seventh Day of September, 2011

David J. Kappos
*Director of the United States Patent and Trademark Office*